(12) United States Patent
Takahashi et al.

(10) Patent No.: US 7,521,739 B2
(45) Date of Patent: Apr. 21, 2009

(54) ILLUMINATING DEVICE AND METHOD OF FABRICATING THE SAME

(75) Inventors: Hideyuki Takahashi, Miyagi-ken (JP); Satoshi Miyazawa, Miyagi-ken (JP); Tsuyoshi Hayama, Miyagi-ken (JP); Akira Nakano, Miyagi-ken (JP); Ryosuke Uchida, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 489 days.

(21) Appl. No.: 11/251,449

(22) Filed: Oct. 14, 2005

(65) Prior Publication Data
US 2006/0097291 A1   May 11, 2006

(30) Foreign Application Priority Data
Nov. 8, 2004   (JP)   ............................. 2004-323805
Jun. 7, 2005   (JP)   ............................. 2005-167129

(51) Int. Cl.
*H01L 31/112* (2006.01)
(52) U.S. Cl. ................ 257/257; 257/E33.068
(58) Field of Classification Search ............ 257/98, 257/184, 432
See application file for complete search history.

(56) References Cited

U.S. PATENT DOCUMENTS

| 5,321,294 | A  | * | 6/1994  | Chino et al. ............... 257/85 |
| 5,893,633 | A  |   | 4/1999  | Uchio et al. |
| 6,927,818 | B2 | * | 8/2005  | Hinata et al. ............. 349/114 |
| 2002/0066858 | A1 | * | 6/2002  | Trempala et al. ......... 250/338.1 |
| 2002/0145871 | A1 |   | 10/2002 | Yoda |
| 2004/0057246 | A1 |   | 3/2004  | Flokstra et al. |
| 2004/0137656 | A1 |   | 7/2004  | Singh |
| 2004/0140543 | A1 | * | 7/2004  | Elpedes et al. ............ 257/676 |
| 2006/0275599 | A1 |   | 12/2006 | Lefevre |

FOREIGN PATENT DOCUMENTS

| JP | 2001-158290 | 6/2001 |
| WO | 2004/062908 | 7/2004 |

OTHER PUBLICATIONS

European Search Report dated Aug. 31, 2007 from corresponding European Application No. 05256486.

* cited by examiner

*Primary Examiner*—Wai-Sing Louie
*Assistant Examiner*—Bilkis Jahan
(74) *Attorney, Agent, or Firm*—Beyer Law Group LLP

(57) ABSTRACT

The illuminating device includes a lens formed of a resin mold and having a portion for receiving an LED which is formed on one surface thereof, the LED received in the receiving portion, and a wiring member deposited on the receiving-portion-forming surface of the lens, and light irradiated from the LED is incident to the lens. In the method of fabricating the illuminating device, a transfer film having a conductive portion is set in a lens molding cavity and a wiring member including a conductive portion is deposited on one surface of the lens while the lens is injected and molded.

1 Claim, 7 Drawing Sheets

ILLUMINATING DEVICE AND METHOD OF FABRICATING THE SAME

BACKGROUND OF THE INVENTION

1. Field of the Invention

The present invention relates to an illuminating device suitable for a room lamp for a vehicle and a method of fabricating the same, and more particularly, to a construction of an illuminating device using a light emitting diode (hereinafter, referred to as "LED") as a light source and a method of fabricating the same.

2. Description of the Related Art

Conventionally, a map lamp or a room lamp for a vehicle includes a small-sized valve lamp (a miniature bulb) as a light source.

FIG. 8 is a cross-sectional view of an illuminating device known in the prior art. As can be apparently seen from FIG. 8, the illuminating device of the present example includes a circuit board 104 on which a socket 101 of a valve lamp, a required chip component 102 such as a resistor and an external connector 103 are mounted, a valve lamp 105 attached to the socket 101, a case 106 which also functions as a reflection plate, and a cover 107 which also functions as lens attached to the case 106.

Since a life span of the valve lamp 105 is short, for example, about 3000 hours, such an illuminating device needs to be constructed such that the cover 107 is detachable from the case 106 in preparation for a case where the valve lamp 105 is required to be replaced. Accordingly, the number of components is large, the construction thereof is complex, and a manufacturing cost is like to increase. Furthermore, since the valve lamp 105 has a large size and a heating value, and should be spaced apart from the cover 107 which functions as the lens at a predetermined distance, the thickness T of the apparatus increases and limits the flexibility of design in the vehicle. In addition, a user needs to replace the valve lamp 105, and thus, adding an increase in cost. In order to solve these defects, the present inventors have considered that an LED having a small heating value and a long life span be used as a light source of an illuminating device such as a room lamp or a map lamp, instead of the valve lamp 105.

Furthermore, in certain equipment for a vehicle, there has been a case where the LED is used as a light source of a dimming switch or a light source of a stop lamp in the vehicle (for example, see JP-A-2001-158290). However, the LED was not used as a light source of an illuminating device included in a vehicle, such as a room lamp or a map lamp.

However, it can not be sufficiently achieved to reduce the thickness of the illuminating device and manufacturing cost thereof by only using the LED instead of the valve lamp 105. That is, since the existing LED has low luminous intensity and a high directivity, a plurality of LEDs are required for obtaining the same lighting range as that of using the valve lamp 105, and thus, the number of the components and the number of the assembling processes increase. Furthermore, even in the case of using the LED, the circuit board and the cover which functions as the lens are necessary components, similar to the case of using the valve lamp 105. Further, since a reflecting plate needs to be included in some cases, if the members are composed similar to the case of using the valve lamp 105, reduction in the thickness of the illuminating device using the LED may be by only a gap provided between the light source and the cover 107 which functions as the lens, and the size difference between the light sources. Therefore, the reduction in thickness can not be significantly obtained.

SUMMARY OF THE INVENTION

The present invention has been finalized in view of the inherent drawbacks in the prior art, and it is an object of the present invention to provide a thin illuminating device having a low cost and a method for easily and cheaply fabricating the illuminating device.

In order to solve the above-described problems, the illuminating device according to a first aspect of the present invention includes a light emitting diode (LED); a lens having a receiving portion for the light emitting diode to diffuse light irradiated from the light emitting diode; and a wiring member having a conductive portion which is electrically connected to the light emitting diode.

According to this construction, since the LED is received in the receiving portion formed in one surface of the lens, the total thickness of the illuminating device becomes a sum of the thickness of the lens and the thickness of the wiring member, the thickness of the illuminating device can be remarkably reduced. Further, since the LED is received in the receiving portion formed in one surface of the lens, the light irradiated from the LED can be directed to the light emitting surface of the lens without waste, and the manufacturing cost of the illuminating device can be reduced due to reduction of the setting number of the LED.

Moreover, in the illuminating device having the above-described construction, the wiring member is formed in a film shape having a reflecting film at the surface thereof and is deposited on the surface of the lens.

According to this construction, since the wiring member is deposited on the surface of the lens in the film shape, the thickness of the illuminating device can be more reduced. Further, since the reflecting film is formed on the wiring member having the film shape, light reflected from the light emitting surface of the lens and returned to the wiring member can be reflected to the light emitting surface of the lens again and thus the lighting efficiency can be more improved.

According to the present invention, in the illuminating device having the above-described construction, a reflecting film is also provided on the surface except for a receiving-portion-forming surface of the lens.

According to this construction, since a light emitting direction can be adequately changed by changing the forming surface of the reflecting film, the flexibility of design for the illuminating device can be increased.

Furthermore, in the illuminating device having the above-described construction according to the present invention, the conductive portion of the wiring member is formed of a transparent conductive material.

According to this construction, since the light of the lens can be emitted from the setting surface of the wiring member, the design freedom of the illuminating device can be increased.

Moreover, according to the present invention, in the illuminating device having the above-described construction, an external connector electrically connected to the conductive portion and integrally provided with the lens is formed.

According to this construction, since connection between the illuminating device and an external device such as a power supply circuit is facilitated, the illuminating device can be easily applied to a vehicle.

Furthermore, the illuminating device according to a second aspect of the present invention includes a light emitting diode (LED); a lens having a receiving portion for the LED to diffuse light irradiated from the LED; a wiring member having a conductive portion which is electrically connected to the LED; a printed circuit board having a conductive portion on which a switch is mounted; a lens housing adhered to the printed circuit board; and a connecting unit for electrically connecting the conductive portion of the wiring member with the conductive portion of the printed circuit board. Here, the lens is received in the lens housing such that the lens can be pressed and the switch can be manipulated by pressing the lens.

According to the illuminating device having the above-mentioned construction, in addition to the same effect as the first aspect, since the switch can be manipulated by pressing the lens, a special member for manipulating the switch can be omitted and thus small-size and low manufacturing cost of the illuminating device can be accomplished.

On the other hand, in order to solve the above-described problems, a method of fabricating an illuminating device according to a third aspect of the present invention includes: preparing a transfer film having a film base on which a reflecting film is formed on one surface thereof, an insulating layer formed on the reflecting film, and a conductive portion with a pattern formed on the insulating layer; setting the transfer film in a molding cavity; ejecting resin into the molding cavity and molding a resin mold including at least one lens to which a conductive-portion-forming surface of the transfer film is closely adhered on one surface thereof, and in which a receiving portion of a light emitting diode is formed on one surface thereof; stripping the film base to expose the reflecting film in one surface of the lens except the inner surface of the receiving portion; receiving the light emitting diode in the receiving portion; and electrically connecting a film-shaped conductive portion transferred from the transfer film with a terminal portion of the light emitting diode.

According to this construction, since the transfer film on which the reflecting film is deposited on one surface thereof is used, the illuminating device including the reflecting film on the receiving-portion-forming surface of the lens except the inner surface of the receiving portion can be fabricated. Also, since the transfer film having the reflecting film, the insulating layer, and the conductive portion is set in the molding cavity and the lens and the film-shaped wiring member are integrally formed upon the injection molding of a resin mold, the illuminating device can be easily fabricated, compared with the case where a reflecting member, a conductive member, and a lens member are individually fabricated and then integrally formed. Further, since the LED is received in the receiving portion and the film-shaped conductive portion transferred from the transfer film is electrically connected to the terminal portion of the LED after fabricating the resin mold, excessive force and heat is not applied to the LED and thus a product can be fabricated with a quality fabrication.

Moreover, in order to solve the above-mentioned problems, a method of fabricating an illuminating device according to a fourth aspect of the present invention includes: preparing a transfer film having a film base, an insulating layer formed on one surface of the film base, and a conductive portion with a pattern formed on the insulating layer; setting the transfer film in a molding cavity; injecting a resin into the molding and molding a resin mold including at least one lens to which a conductive-portion-forming surface of the transfer film is closely adhered on one surface thereof, and in which a receiving portion for a light emitting diode is formed on one surface thereof; stripping the film base to expose the insulating layer in one surface of the lens; receiving the light emitting diode in the receiving portion; and electrically connecting a film-shaped conductive portion transferred from the transfer film with a terminal portion of the light emitting diode.

According to this construction, since the transfer film having the insulating layer and the conductive layer and not having the reflecting film is used, the illuminating device which does not have the reflecting film on the receiving-portion-forming surface of the lens except the inner surface of the receiving portion can be fabricated. The other effects are similar to those of the third aspect.

Since the illuminating device according to the present invention includes a light emitting diode (LED); a lens having a receiving portion for the light emitting diode to diffuse light irradiated from the light emitting diode; and a wiring member having a conductive portion which is electrically connected to the light emitting diode, the LED can be received in the receiving portion formed in one surface of the lens and thus the total thickness of the illuminating device becomes a sum of the thickness of the lens and the thickness of the wiring member. Thus, the thickness of the illuminating device can be remarkably reduced. Further, the light irradiated from the LED can be directed to the light emitting surface of the lens without waste and manufacturing cost of the illuminating device can be reduced due to reduction of the setting number of LEDs. In addition, if the switch is manipulated by pressing the lens, a special member for manipulating the switch can be omitted and thus small-size and low manufacturing cost of the illuminating device can be accomplished.

In the method of fabricating the illuminating device according to the present invention, since the lens and the film-shaped wiring member are integrally formed upon the injection molding of the resin mold, the illuminating device can be easily fabricated, compared with the case where members are individually fabricated and then integrally formed. Further, since the LED is received in the receiving portion and the film-shaped conductive portion transferred from the transfer film is electrically connected to the terminal portion of the LED after fabricating the resin mold, excessive force and heat is not applied to the LED and thus a product can be fabricated with a quality fabrication.

DESCRIPTION OF THE PREFERRED EMBODIMENT

Figure 1:
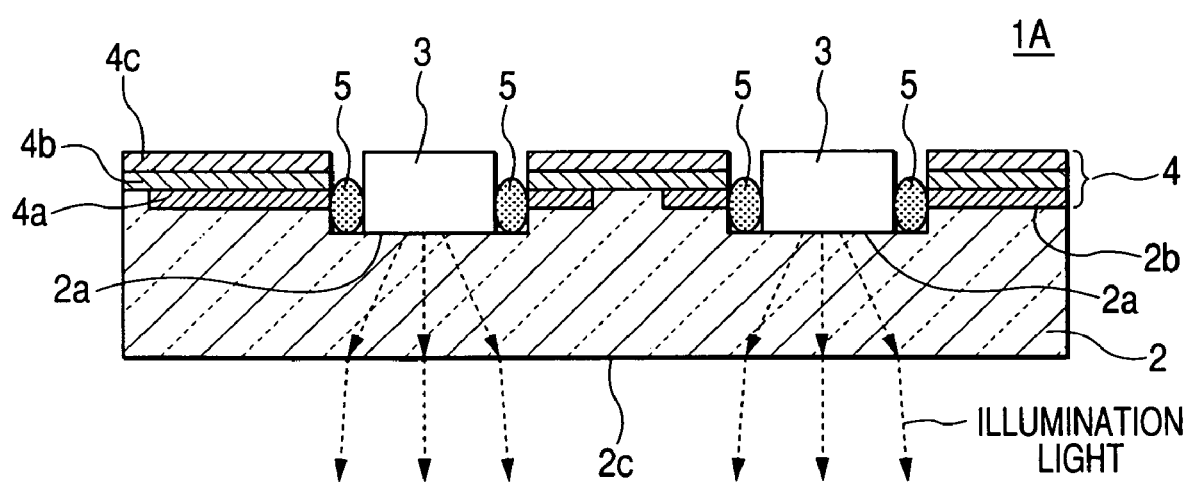
FIG. 1 is a cross-sectional view of an illuminating device according to a first embodiment of the present invention.

First, an illuminating device according to a first embodiment of the present invention will be described with reference to FIG. 1. FIG. 1 is a cross-sectional view of an illuminating device according to a first embodiment of the present invention. The illuminating device according to the present embodiment is characterized in that a reflecting film is provided on one surface of a lens.

As shown in FIG. 1, the illuminating device 1A according to the present embodiment includes a lens 2 having a receiving portion 2a for receiving an LED on one surface thereof, an LED 3 received in the receiving portion 2a, and a film-shaped wiring member 4 formed on a receiving-portion-forming surface 2b of the lens 2 except for the inner surface of the receiving portion 2a.

The film-shaped wiring member 4 includes a conductive portion 4a contacting the receiving-portion-forming surface 2b, an insulating layer 4b provided at the outer surface of the conductive portion 4a, and a reflecting film 4c provided at the outer surface of the insulating layer 4b. A terminal portion of the LED 3 and the conductive portion 4a are electrically connected to each other through a conductive adhesive 5. The conductive portion 4a may be formed of a conductive paste composed by dispersing metal powder into a binder, the insulating layer 4b may be formed of a transparent adhesive, and the reflecting layer 4c may be formed of an aluminum deposition film.

The lens 2 also functions as a cover for the illuminating device and is formed of an injection molded part of transparent resin such as polycarbonate, polymethylmethacrylate, polyethylene terephthalate, polyethylene naphthalate. Furthermore, in FIG. 1, the receiving-portion-forming surface 2b and a light emitting surface 2c of the lens 2 are shown in a plane shape, respectively, but the present embodiment is not limited to this, and the surfaces 2b, 2c may be curved surfaces. Also, if necessary, a receiving portion for receiving a chip component such as a resistor may be formed, which is not shown in FIG. 1. The chip component is connected to the conductive portion 4a of the wiring member 4.

The LED 3 may be selected from any adequate conventional LEDs, and a white LED is particularly suitable as a light source of the illuminating device included in a vehicle, such as a room lamp or a map lamp. This LED 3 is received in the receiving portion 2a to face the light emitting surface 2c of the lens 2.

In the illuminating device 1A according to the first embodiment, since the LED 3 is received in the concave hole-shaped receiving portion 2a formed in one surface of the lens 2 and the film-shaped wiring member 4 having the conductive portion 4a is deposited on the receiving-portion-forming surface 2b of the lens 2, the total thickness of the illuminating device may be a sum of the thickness of the lens 2 and the thickness of the film-shaped wiring member 4, thereby remarkably reducing the total thickness of the illuminating device. Further, since the LED 3 is received in the receiving portion 2a formed in one surface of the lens 2, the light irradiated from the LED 3 can be directed to the light emitting surface 2c of the lens 2 without waste and thus, the manufacturing cost of the illuminating device can be reduced due to reduction of the setting number of the LEDs 3. Also, in the illuminating device 1A according to the first embodiment, since the reflecting film 4c is provided at the outer surface of the insulating layer 4b, the light which is reflected from the light emitting surface 2c of the lens 2 and returned to the wiring member 4 can be returned from the reflecting film 4c to the light emitting surface 2c of the lens 2 again, thereby improving illuminating efficiency better.

Hereinafter, a method of fabricating the illuminating device 1A according to the first embodiment will be described with reference to FIG. 2. FIG. 2 is a flowchart illustrating the method of fabricating the illuminating device according to the first embodiment of the present invention.

Figure 2A:
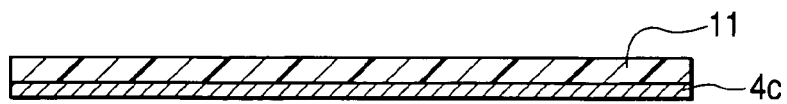
FIG. 2 is a flowchart illustrating a method of fabricating the illuminating device according to the first embodiment of the present invention.
Figure 2B:
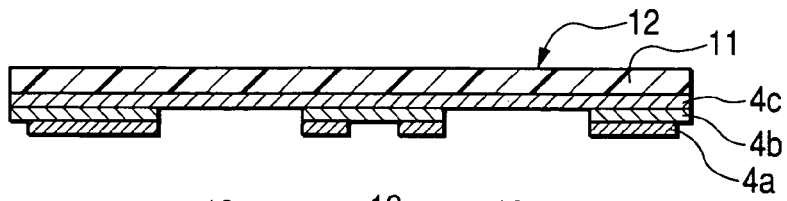
Figure 2C:
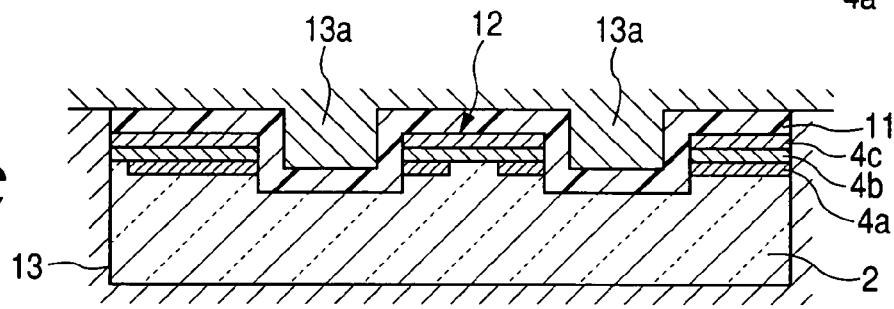
Figure 2D:
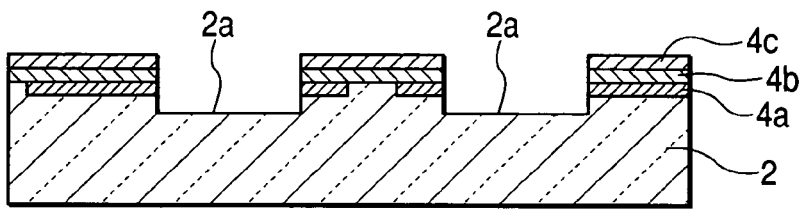
Figure 2E:
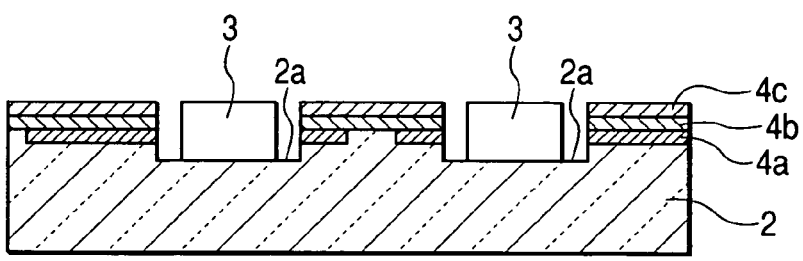
Figure 2F:
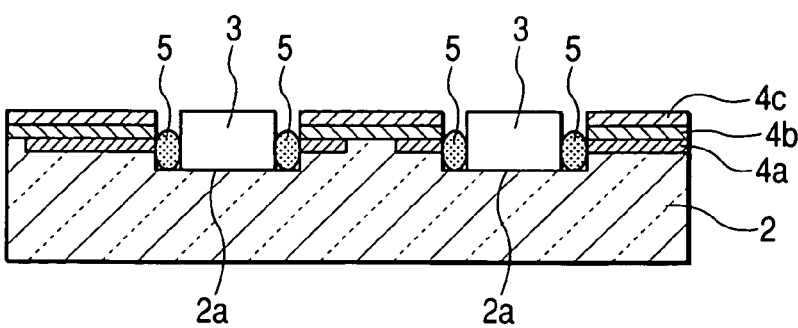

First, as shown in FIG. 2A, the reflecting film 4c such as aluminum is formed on one surface of the film base 11 formed of a resin film such as polyethylene terephthalate, polyethylene naphthalate, polyphenylene sulfide, polyetherimide, and polyimid. Subsequently, as shown in FIG. 2B, the insulating layer 4b formed of the transparent adhesive and the conductive portion 4a formed of the conductive paste are formed on the reflecting film 4c by a screen print in this order. Thus, a transfer film 12 is obtained. Subsequently, as shown in FIG. 2C, the transfer film 12 is set in the lens molding cavity 13 and then resin is injected into the molding cavity 13. A protrusion 13a for forming the receiving portion 2a for receiving the LED in the lens 2 is formed on one surface of the molding cavity 13, and the injection of the transparent resin is performed from the conductive-portion-forming surface of the transfer film 12. To this end, the receiving portion 2a for receiving the LED is formed in one surface and the lens 2 with which the transfer film 12 is closely adhered toward the conductive portion 4a in the forming surface of the receiving portion 2a. Subsequently, as shown in FIG. 2D, the film base 11 is stripped and the reflecting film 4c is exposed in the receiving-portion-forming surface 2b of the lens 2 except for the inner surface of the receiving portion 2a and the reflecting film 4c deposited on the inner surface of the receiving portion 2a is removed. The stripping of the film base 11 and the selective removing of the reflecting film 4c may be simultaneously performed by weakening adhesive strength between the film base 11 and the reflecting film 4c than adhesive strength between the reflecting film 4c and the insulating layer 4b, adhesive strength between the insulating layer 4b and the conductive portion 4a, and adhesive strength between the conductive portion 4a and the lens 2 and strengthening the adhesive strength between the film base 11 and the reflecting film 4c than adhesion between the reflecting film 4c and the lens 2. Subsequently, as shown in FIG. 2E, the LED 3 is received in the receiving portion 2a such that the light emitting surface thereof faces the light emitting surface 2c of the lens 2. Finally, as shown in FIG. 2F, the conductive portion 4a of the transfer film 12 and the terminal portion of the LED 3 are electrically connected to each other through the conductive adhesive 5, thereby obtaining the illuminating device 1A. Furthermore, if necessary, upon the injection molding of the lens 2, the receiving portion for receiving the chip component such as a resistor is formed and then the chip component received in the receiving portion is electrically connected to the conductive portion 4a of the transfer film 12 through the conductive adhesive 5.

Figure 8:
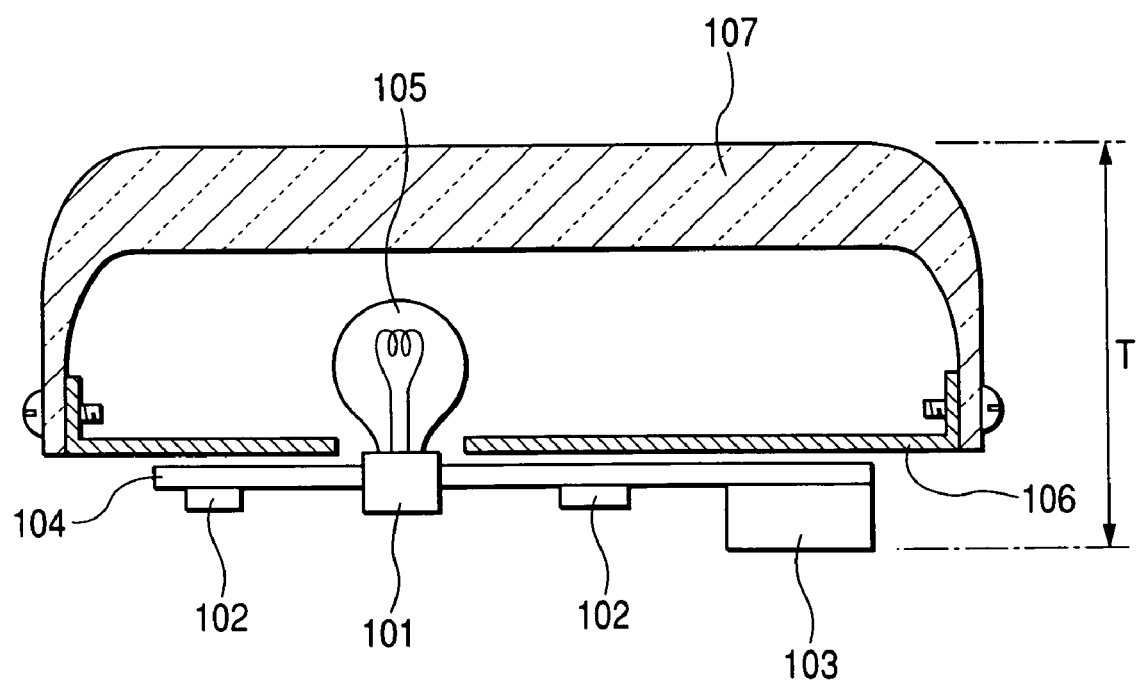
FIG. 8 is a cross-sectional view of a conventional illuminating device.

In the method of fabricating the illuminating device according to the present embodiment, since the transfer film 12 on which the reflecting film 4c is deposited on one surface, the illuminating device 1A having the reflecting film 4c in the receiving-portion-forming surface 2b of the lens except for the inner surface of the receiving portion 2a can be fabricated. Also, since the transfer film 12 having the conductive portion 4a, the insulating layer 4b, and the reflecting film 4c is set in the molding cavity 13 and the lens 2, the conductive portion 4a, the insulating layer 4b, and the reflecting film 4c become integral upon the injection molding of the lens 2, the illuminating device can be more easily fabricated, as compared with the case where the reflecting member, the conductive member, and the lens member are individually fabricated and then integrally formed, in the conventional illuminating device shown in FIG. 8. Moreover, since the injection molding of the lens 2 is performed and then the reception of the LED 3 into the receiving portion 2a and the electrical connection between the film-shaped conductive portion 4a transferred from the transfer film 12 and the terminal portion of the LED 3 are performed, excessive external force and heat is not applied to the LED 3 and thus a product can be fabricated with quality fabrication.

Figure 3:
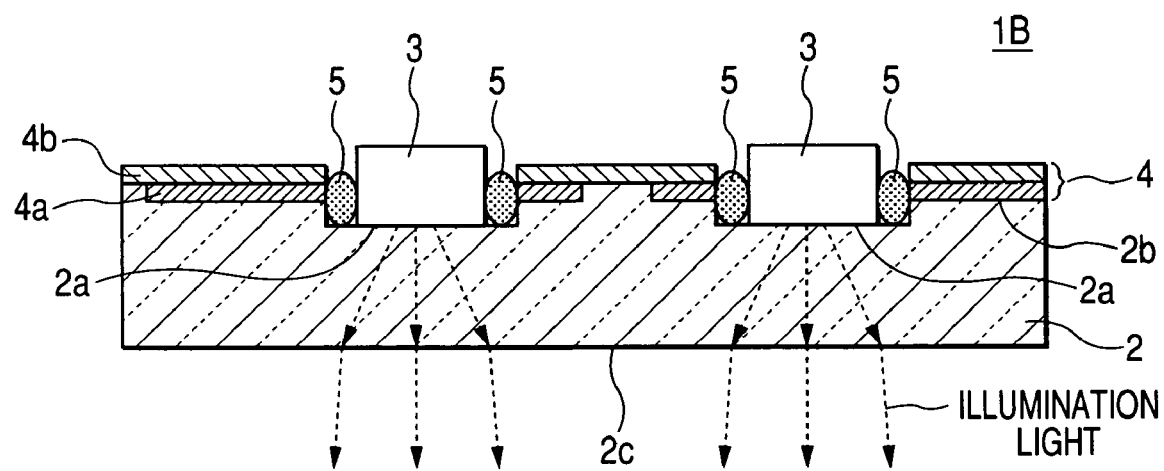
FIG. 3 is a cross-sectional view of an illuminating device according to a second embodiment of the present invention.

Next, an illuminating device according to a second embodiment of the present invention will be described with reference to FIG. 3. FIG. 3 is a cross-sectional view of an illuminating device according to the second embodiment of the present invention. The illuminating device according to the present embodiment is characterized in that the reflecting film of the illuminating device 1A according to the first embodiment is omitted.

As shown in FIG. 3, in the illuminating device 1B according to the present embodiment, a film-shaped wiring member 4 includes a conductive portion 4a contacting the receiving-portion-forming surface 2b and an insulating layer 4b provided at the outer surface of the conductive portion 4a, and the reflecting film 4c included in the illuminating device 1A according to the first embodiment is omitted. Since the other portions are similar to those of the illuminating device 1A according to the first embodiment, corresponding components are denoted by same reference numerals and thus their description will be described.

The illuminating device 1B according to the second embodiment does not have the reflecting film at the outer surface of the insulating layer 4b, the same effect as that of the illuminating device 1A according to the first embodiment except that the light reflected from the light emitting surface 2c of the lens 2 and returned to the wiring member 4 can not be reflected to the light emitting surface 2c of the lens 2 can be obtained.

Hereinafter, a method of fabricating the illuminating device 1B according to the second embodiment of the present invention will be described with reference to FIG. 4. FIG. 4 is a flowchart illustrating a method of fabricating the illuminating device according to the second embodiment of the present invention.

Figure 4A:
FIG. 4 is a flowchart illustrating a method of fabricating the illuminating device according to the second embodiment of the present invention.
Figure 4B:
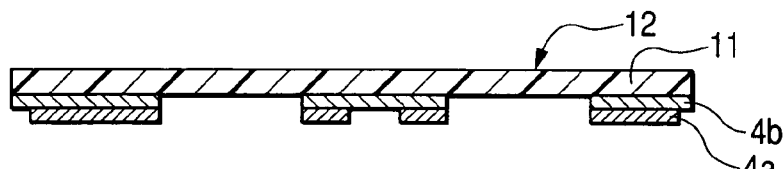
Figure 4C:
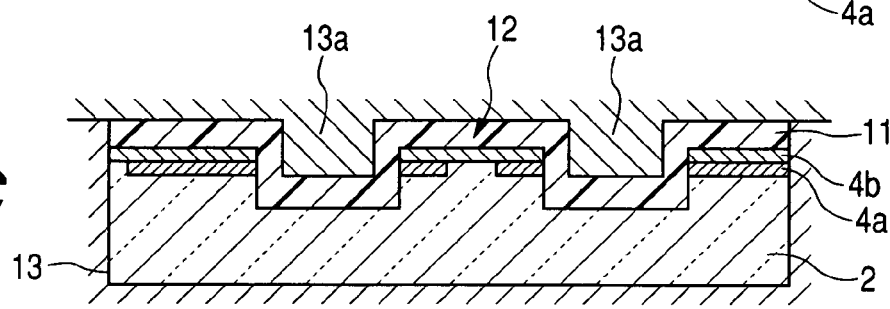
Figure 4D:
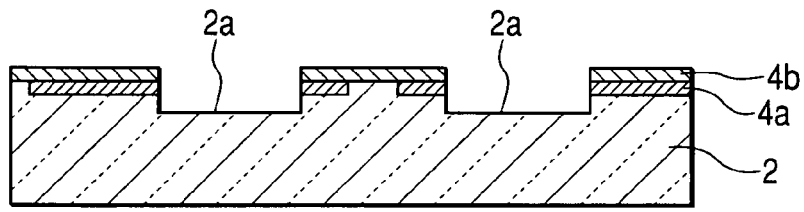
Figure 4E:
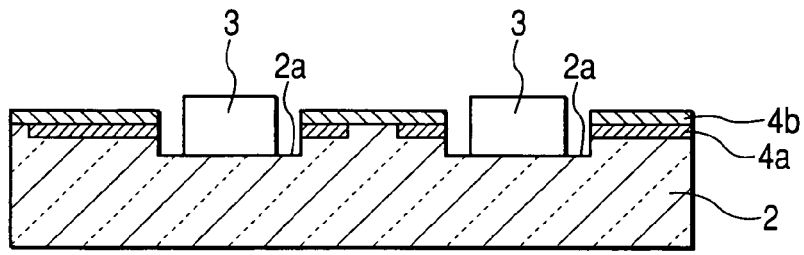
Figure 4F:
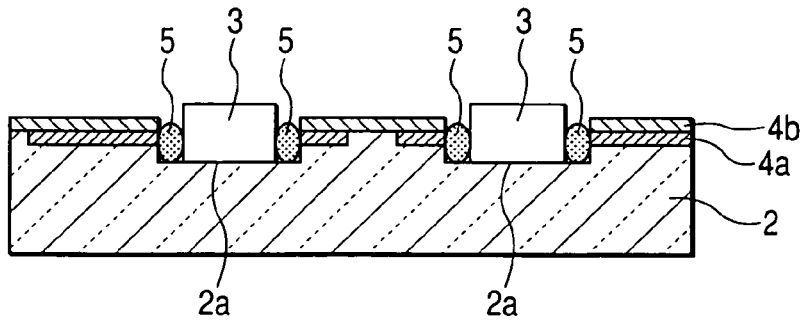

As can be seen from comparison between FIG. 2B and FIG. 4B, the method according to the present embodiment is different from the method of fabricating the illuminating device according to the first embodiment in that the insulating layer 4b and the conductive layer 4a are formed on one surface of the film base 11, in this order, as a transfer film 12. Further, after the injection molding of the lens 2, as shown in FIG. 4D, the film base 11 is stripped, the insulating layer 4b is exposed in the receiving-portion-forming surface 2b of the lens 2 except for the inner surface of the receiving portion 2a, and the reflecting film 4c deposited on the inner surface of the receiving portion 2a is removed. The stripping of the film base 11 and the selective removing of the reflecting film 4c may be performed by weakening adhesive strength between the film base 11 and the insulating layer 4b than adhesive strength between the insulating layer 4b and the conductive portion 4a and adhesive strength between the conductive portion 4a and the lens 2. Since the other portions are similar to those of the method of fabricating the illuminating device 1A according to the first embodiment, corresponding portions are denoted by the same reference numerals and thus, their description will be described.

According to the method of fabricating the illuminating device of the present embodiment, since the transfer film 12 having the conductive portion 4a and the insulating layer 4b and not having the reflecting film 12 is used, the illuminating device 1B in which the reflecting film is not provided in the receiving-portion-forming surface 2b of the lens 2 except for the inner surface of the receiving portion 2a can be fabricated.

Figure 5:
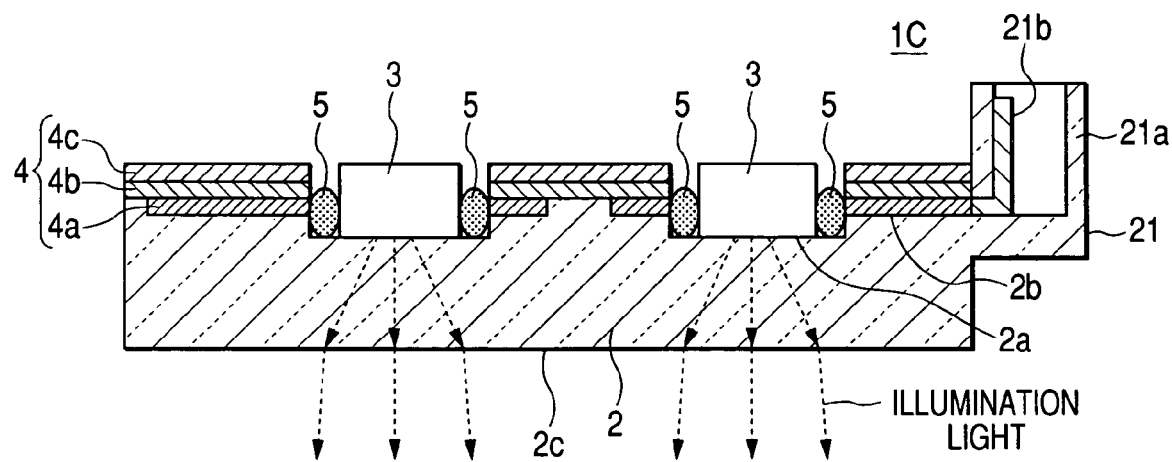
FIG. 5 is a cross-sectional view of an illuminating device according to a third embodiment of the present invention.

Next, an illuminating device according to a third embodiment of the present invention will be described with reference to FIG. 5. FIG. 5 is a cross-sectional view of an illuminating device according to the third embodiment of the present invention. The illuminating device according to the present embodiment is characterized in that an external connector is integrally provided with the lens.

As shown in FIG. 5, the illuminating device 1c according to the present embodiment includes the external connector 21 which is integrally provided with the lens 2 and electrically connects the lens 2 with an external device such as an LED 3 and a power supply circuit. The external connector 21 includes a main body 21a made of resin and a terminal portion 21b set in the main body 21a, and the terminal portion 21b is electrically connected to the conductive portion 4a. The main body 21a may be formed of the same kind of a resin material as the material forming the lens 2 or a kind of a resin material different from the material forming the lens 2. In case the main body 21a is formed of the same kind of the resin material as the material forming the lens 2, the lens 2 and the main body 21a may be simultaneously formed in a mold. On the other hand, in case the main body 21a is formed of a kind of resin material different from the material forming the lens 2, the lens 2 and the main body 21a are integrally formed by two-color molding. Since the other portions are similar to those of the illuminating device 1A according to the first embodiment, corresponding portions are denoted by same reference numerals and thus, their description will be described.

In the illuminating device 1C according to the third embodiment, since the external connector 21 is integrally provided in addition to the same effect as the illuminating device 1A according to the first embodiment, the connection between the illuminating device and the external device can be facilitated and thus can easily apply to a vehicle.

Furthermore, even though, in the third embodiment, the external connector is included in the illuminating device 1A according to the first embodiment, the external connector may be included in the illuminating device 1B according to the second embodiment.

Figure 6:
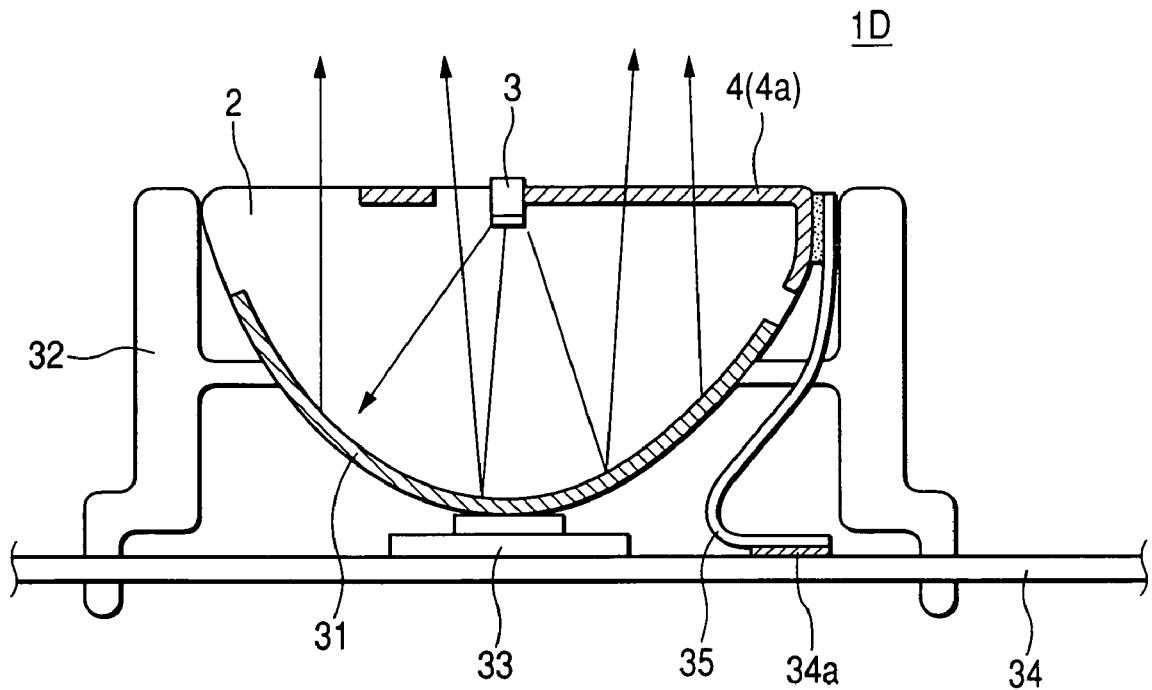
FIG. 6 is a cross-sectional view of an illuminating device according to a fourth embodiment of the present invention.

Next, an illuminating device according to a fourth embodiment of the present invention will be described with reference to FIG. 6. FIG. 6 is a cross-sectional view of an illuminating device according to the fourth embodiment of the present invention. The illuminating device according to the present embodiment is characterized in that a lens is composed such that light is emitted from the receiving-portion-forming surface of an LED and a switch is manipulated by pressing the lens.

As shown in FIG. 6, the illuminating device 1D according to the present embodiment includes a lens 2 having a wiring member 4, a reflecting film 31, and a receiving portion 2a; a receiving portion 2a to receive an LED 3; a lens housing 32 holding the lens which can be vertically movable; a printed circuit board 34 on which the lens housing 32 and a switch 33 are adhered; and a flexible circuit board 35 (connecting unit) for electrically connecting a conductive portion 4a of the wiring member 4 with a conductive portion 34a of the printed circuit board 34.

The wiring member 4 is formed over a portion from a receiving-portion-forming surface 2b of the lens 2 to a portion of a convex surface (lens surface) adjacent thereto. Also, the conductive portion 4a of the wiring member 4 is formed of a transparent conductive material such as indium-tin-oxide (ITO). Since the other portions are similar to those of the second embodiment, corresponding portions are denoted by the same reference numerals and thus, their description will be omitted.

The reflecting film 31 is formed on the convex surface of the lens 2 except for the forming portion of the wiring member 4. The reflecting film 31 may be formed by molding the lens 2 and then sputtering or vacuum-depositing a material having a high reflectivity such as aluminum.

The lens housing 32 is formed of a metal material or a plastic material in a tube shape having a predetermined shape and size to maintain the lens 2, and one end thereof is adhered to the surface of the printed circuit board 34. The lens 2 is received in the lens housing 32 such that the reflecting film 31 faces the printed circuit board 34, and adhered to the lens housing 32 such that it can be vertically moved in a range which can switch the below-described switch 33.

The printed circuit board 34 is formed by forming the conductive portion 34a formed of, for example, a copper foil on one surface or both surfaces of an insulating board, and, as shown in FIG. 6, the switch 33 is mounted on a center of a setting portion of the lens housing 32. As the switch 33, a push switch is used.

The flexible circuit board 35 is formed by forming a conductive portion (not shown) formed of a copper foil on a flexible insulating film, and electrically connects the conductive portion 4a of the wiring member 4 with the conductive portion 34a of the printed circuit board 34.

In the illuminating device 1D according to the present embodiment, the switch 33 is manipulated whenever the lens 2 is pressed on the printed circuit board 34 to switch on/off the LED 3. As shown in FIG. 6, the light irradiated from the LED 3 is reflected from the reflecting film 31 formed on the lens surface and irradiated to the outside through the transparent conductive portion 4a of the wiring member 4 and the receiving-portion-forming surface 2b of the lens 2.

Since, in the illuminating device 1D according to the fourth embodiment, the switch 33 is manipulated by pressing the lens 2, a special member for manipulating the switch 33 can be omitted and thus small-size and low manufacturing cost of the illuminating device can be accomplished.

Figure 7:
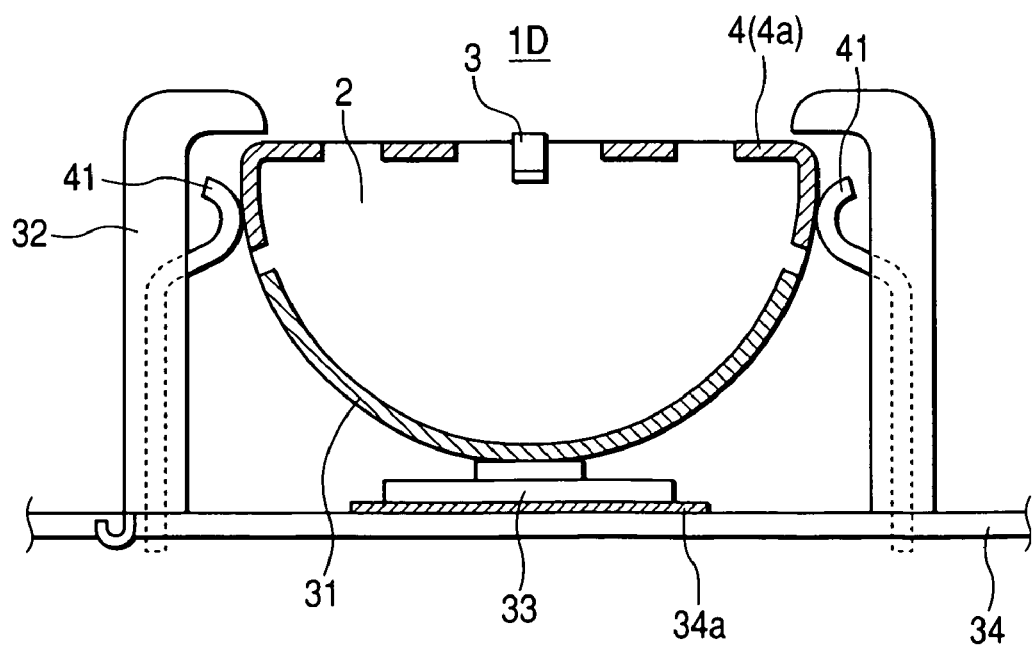
FIG. 7 is a cross-sectional view of an illuminating device according to a fifth embodiment of the present invention.

Further, although, in the illuminating device 1D according to the fourth embodiment, the flexible circuit board 35 is included in a connecting unit for electrically connecting the conductive portion 4a of the wiring member 4 with the conductive portion 34a of the printed circuit board 34, a brush 41 of which one end is electrically connected with the conductive portion 34a of the printed circuit board 34 may be included as the connecting unit, and the front end of the brush 41 may elastically contact the conductive portion 4a of the wiring member 4, as shown in FIG. 7.

The invention claimed is:

1. An illuminating device comprising:
   a light emitting diode;
   a lens including a first surface having a concave portion for receiving the light emitting diode, the lens diffusing light irradiated from the light emitting diode and emitting the diffused light;
   a wiring member having a conductive portion which is electrically connected to the light emitting diode;
   a printed circuit board having a conductive portion;
   a switch mounted on the conductive portion of the printed circuit;
   a lens housing adhered to the printed circuit board; and
   a connecting unit for electrically connecting the conductive portion of the wiring member with the conductive portion of the printed circuit board,
   wherein the lens is received in the lens housing such that the lens can be pressed and the switch can be manipulated by pressing the lens.

* * * * *